United States Patent
Kurihara

(10) Patent No.: US 10,128,025 B2
(45) Date of Patent: Nov. 13, 2018

(54) OXIDE SUPERCONDUCTING WIRE, SUPERCONDUCTING DEVICE, AND METHOD FOR PRODUCING OXIDE SUPERCONDUCTING WIRE

(71) Applicant: FUJIKURA LTD., Tokyo (JP)

(72) Inventor: Chihaya Kurihara, Sakura (JP)

(73) Assignee: FUJIKURA LTD., Tokyo (JP)

(*) Notice: Subject to any disclaimer, the term of this patent is extended or adjusted under 35 U.S.C. 154(b) by 0 days.

(21) Appl. No.: 15/501,248

(22) PCT Filed: Jul. 2, 2015

(86) PCT No.: PCT/JP2015/069117
§ 371 (c)(1),
(2) Date: Feb. 2, 2017

(87) PCT Pub. No.: WO2016/021343
PCT Pub. Date: Feb. 11, 2016

(65) Prior Publication Data
US 2017/0221609 A1    Aug. 3, 2017

(30) Foreign Application Priority Data
Aug. 5, 2014 (JP) ................. 2014-159685

(51) Int. Cl.
| H01B 12/06 | (2006.01) |
| H01B 12/02 | (2006.01) |
| H01B 13/00 | (2006.01) |
| H01B 13/22 | (2006.01) |
| H01F 6/00 | (2006.01) |

(52) U.S. Cl.
CPC ............ H01B 12/06 (2013.01); H01B 12/02 (2013.01); H01B 13/0026 (2013.01); H01B 13/22 (2013.01); H01F 2006/001 (2013.01)

(58) Field of Classification Search
CPC ..... H01B 12/06; H01B 13/22; H01B 13/0026
See application file for complete search history.

(56) References Cited

U.S. PATENT DOCUMENTS

| 7,774,035 B2 | 8/2010 | Lee et al. |
| 2003/0134749 A1 | 7/2003 | Onabe et al. |

(Continued)

FOREIGN PATENT DOCUMENTS

| CN | 1395261 A | 2/2003 |
| EP | 2801983 A1 | 11/2014 |

(Continued)

OTHER PUBLICATIONS

International Search Report dated Aug. 18, 2015, issued in counterpart International Application No. PCT/JP2015/069117 (2 pages).

(Continued)

*Primary Examiner* — Paul A Wartalowicz
(74) *Attorney, Agent, or Firm* — Westerman, Hattori, Daniels & Adrian, LLP

(57) ABSTRACT

An oxide superconducting wire includes: a laminate which is formed by laminating a tape-shaped base, an intermediate layer, and an oxide superconducting layer; a first protective layer which is formed of Ag or an Ag alloy and is laminated on a main surface of the oxide superconducting layer of the laminate; a second protective layer which is formed of Cu or a Cu alloy, is laminated on a main surface of the first protective layer by performing film formation one or more times, and has a thickness of 0.3 μm to 10 μm; and a stabilization layer which is bonded to a main surface of the second protective layer with a solder layer interposed therebetween, wherein the second protective layer is formed to have a thickness of equal to or less than 2.1 μm per film formation.

8 Claims, 3 Drawing Sheets

(56) References Cited

U.S. PATENT DOCUMENTS

| | | | |
|---|---|---|---|
| 2006/0240272 A1* | 10/2006 | Miura | B32B 15/017 |
| | | | 428/607 |
| 2010/0173784 A1* | 7/2010 | Lee | H01L 39/143 |
| | | | 505/237 |
| 2011/0319271 A1* | 12/2011 | Selvamanickam | H01L 39/143 |
| | | | 505/231 |
| 2012/0181062 A1 | 7/2012 | Neumuller et al. | |
| 2014/0323314 A1* | 10/2014 | Takemoto | H01L 39/143 |
| | | | 505/230 |
| 2015/0045230 A1 | 2/2015 | Shingai et al. | |

FOREIGN PATENT DOCUMENTS

| | | | | |
|---|---|---|---|---|
| JP | 2010-176892 A | 8/2010 | | |
| JP | 2013-503422 A | 1/2013 | | |
| JP | 2013-30317 A | 2/2013 | | |
| JP | 2013-218915 A | 10/2013 | | |
| JP | 2013-232297 A | 11/2013 | | |
| WO | WO 2013/077387 | * | 5/2013 | H01B 12/06 |
| WO | 2013/129568 A1 | 9/2013 | | |

OTHER PUBLICATIONS

Notice of Allowance JP Application No. 2014-159685, dated Nov. 29, 2016 (3 pages).

Japanese Patent Application No. 2014-096104 filed on May 7, 2014 to which JP 2014-159685 claims a priority.

Extended (supplementary) European Search Report dated Mar. 12, 2018, issued in counterpart European Application No. 15829331.6. (6 pages).

Office Action dated Jul. 30, 2018, issued in counterpart Chinese application No. 201580049991.5, with English translation. (15 pages).

* cited by examiner

OXIDE SUPERCONDUCTING WIRE, SUPERCONDUCTING DEVICE, AND METHOD FOR PRODUCING OXIDE SUPERCONDUCTING WIRE

TECHNICAL FIELD

The present invention relates to an oxide superconducting wire, a superconducting device, and a method of producing an oxide superconducting wire.

Priority is claimed on Japanese Patent Application No. 2014-159685, filed on Aug. 5, 2014, the content of which is incorporated herein by reference.

BACKGROUND ART

RE123-based oxide superconductors are formed in a composition expressed by $RE_1Ba_2Cu_3O_{7-x}$ (RE: rare earth element, such as Y or Gd), and have a critical temperature higher than a liquid nitrogen temperature (77K). Studies have been conducted in many places to apply these oxide superconductive conductors to a superconducting magnet or various superconducting devices, such as a transformer, a fault current limiter, and a motor.

In order to use oxide superconductors in various superconducting devices, in general, an oxide superconductor is worked into a wire, and is used as a conductor of electric power supply or an oxide superconducting wire, such as a magnetic coil. Specifically, an oxide superconducting wire in which an oxide superconducting tape with an Ag layer provided on the surface of an oxide superconductor layer is bonded to a stabilizer tape (stabilization layer) with solder interposed therebetween is known. The Ag layer is provided on the surface of the oxide superconducting layer, whereby it is possible to protect the oxide superconducting layer and to suppress deterioration of the oxide superconducting layer due to moisture.

However, if the solder is bonded to the Ag layer, an alloy layer is formed at the interface between the Ag layer and the solder and electric stability is degraded. Furthermore, since Ag is embrittled due to alloying and is deteriorated in strength, there is a problem in that the stabilization layer is separated from the Ag layer.

Accordingly, in Patent Document 1, a plated layer made of an alloy of Cu or the like is provided on an Ag layer, and contact of the Ag layer and solder is limited to suppress embrittlement of Ag.

PRIOR ART DOCUMENTS

Patent Documents

[Patent Document 1] Japanese Unexamined Patent Application, First Publication No. 2013-218915

SUMMARY OF THE INVENTION

Problems to be Solved by the Invention

In the technique described in Patent Document 1, the plated layer provided on the Ag layer is formed by plating. For this reason, the thickness of the plated layer becomes very thick to be approximately 20 µm. Accordingly, material costs increase. Furthermore, a pinhole may occur in the Ag layer, and in such a case, if plating processing is performed, a plating liquid comes into contact with the oxide superconducting layer below the Ag layer, and superconducting characteristics may be degraded.

The invention has been accomplished in consideration of the above-described problems, and an object of the invention is to provide an oxide superconducting wire which is excellent in cost and superconducting characteristics while suppressing separation of a stabilization layer due to embrittlement of Ag.

Means for Solving the Problems

In order to solve the above-described problems, an oxide superconducting wire according to a first aspect of the invention includes a laminate which is formed by laminating a tape-shaped base, an intermediate layer, and an oxide superconducting layer, a first protective layer which is formed of Ag or an Ag alloy and is laminated on a main surface of the oxide superconducting layer of the laminate, a second protective layer which is formed of Cu or a Cu alloy, is laminated on a main surface of the first protective layer by performing film formation one or more times, and has a thickness of 0.3 µm to 10 µm, and a stabilization layer which is bonded to a main surface of the second protective layer with a solder layer interposed therebetween. The second protective layer is formed to have a thickness of equal to or less than 2.1 µm per film formation.

With this, the second protective layer is formed between the first protective layer formed of Ag or an Ag alloy and the solder layer. Accordingly, Ag or the Ag alloy does not come into contact with the solder, and it is possible to prevent the solder from being alloyed with Ag and embrittled. Therefore, it is possible to prevent the stabilization layer from being separated from the oxide superconducting wire.

The second protective layer formed of Cu or the Cu alloy has a thickness of 0.3 µm to 10 µm, whereby it is possible to prevent separation of the stabilization layer due to embrittlement of Cu while achieving reduction in costs by reducing the thickness of the second protective layer in a cross section of the oxide superconducting wire.

Besides Ag, Cu is embrittled due to alloying with the solder. The inventors have conducted intensive studies and have found that embrittlement occurs due to alloying of Cu and the solder in a case where Cu has a thickness of less than 0.3 µm. Accordingly, the second protective layer formed of Cu or the Cu alloy has a thickness of equal to or greater than 0.3 µm, whereby it is possible to prevent separation of the stabilization layer due to alloying of Cu.

The second protective layer having such the thickness is obtained by forming the film of Cu or a Cu alloy using a sputtering method. If the film of Cu or the Cu alloy is about to be formed to have a thickness of greater than 2.1 µm by a single film formation process in the sputtering method, oxygen may slip out of the oxide superconducting layer, a crystal structure may collapse, and deterioration of superconducting characteristics may occur. In the above-described aspect, since the thickness of the second protective layer formed by a single film formation process is equal to or less than 2.1 µm, there is little concern that the characteristics of the oxide superconducting wire are deteriorated.

The oxide superconducting layer may be formed to include a neutral surface in a thickness direction of an entire of the wire.

With this, the neutral surface of the oxide superconducting wire is arranged on the oxide superconducting layer, and it is possible to minimize a load applied to the oxide superconducting layer with respect to bending.

The oxide superconducting wire may further include a rear surface layer which is laminated on a rear surface of the base of the laminate and is formed of Cu or a Cu alloy. The stabilization layer may be arranged to wrap around both side surfaces from a main surface of the laminate and to reach a rear surface, and may be bonded to the rear surface layer with a solder layer interposed therebetween.

With this, the rear surface layer formed of Cu or the Cu alloy having excellent adhesion to the solder is formed on the rear surface of the laminate, whereby it is possible to bond the stabilization layer to the rear surface side with the solder layer interposed therebetween. Therefore, in the oxide superconducting wire according to the above-described aspect, it is possible to increase airtightness of the oxide superconducting wire by bringing the stabilization layer into close contact with the outer circumference of the cross section of the laminate.

The stabilization layer may be formed of one of the group consisting of a Ni—Cr alloy, a Ni alloy, stainless steel, and brass.

With this, metal having a comparatively high electrical resistance value is used as the stabilization layer, whereby it is possible to increase electrical resistance of the oxide superconducting wire at room temperature. Therefore, it is possible to provide an oxide superconducting wire which has a high effect for instantly suppressing an overcurrent generated when quenching occurs and transition is made to a normal conduction state and is suitable for a superconducting fault current limiter.

The second protective layer may have a thickness of equal to or less than 2.1 µm.

With this, since the second protective layer can be formed only by single film formation using the sputtering method, it is possible to prevent separation of the stabilization layer due to embrittlement of Cu while achieving further reduction in costs.

A superconducting device according to a second aspect of the invention includes the above-described oxide superconducting wire.

With this, it is possible to provide a superconducting device having high reliability.

A method of producing an oxide superconducting wire according to a third aspect of the invention includes preparing a laminate in which an intermediate layer and an oxide superconducting layer are formed on a tape-shaped base, forming a first protective layer formed of Ag or an Ag alloy on a main surface of the oxide superconducting layer of the laminate using a sputtering method, forming a second protective layer formed of Cu or a Cu alloy to have a thickness of 0.3 µm to 2.1 µm on a main surface of the first protective layer using a sputtering method, and forming a stabilization layer by bonding a metal tape to a main surface of the second protective layer with a solder layer interposed therebetween. When film-forming the second protective layer, film formation is performed one or more times, and the second protective layer is formed to have a thickness of equal to or less than 2.1 µm per film formation.

With this, it is possible to form an oxide superconducting wire in which Ag or an Ag alloy does not come into contact with solder. Accordingly, it is possible to provide an oxide superconducting wire in which a stabilization layer is hardly separated.

The film of Cu or the Cu alloy is formed using the sputtering method, whereby it is possible to form the thin second protective layer having a thickness of equal to or less than 2.1 µm. If the thickness of the second protective layer is equal to or less than 2.1 µm, there is little concern that the characteristics of the oxide superconducting wire are deteriorated only by performing a single film formation process.

In the above-described third aspect, before forming the stabilization layer, a rear surface layer formed of Cu or a Cu alloy may be formed on a rear surface of the base of the laminate using a sputtering method, and when forming the stabilization layer, the metal tape may be arranged to wrap around the rear surface by way of both side surfaces from a main surface of the laminate, and the metal tape may be bonded to the rear surface layer with a solder layer interposed therebetween.

With this, the rear surface layer formed of Cu or the Cu alloy having excellent adhesion to the solder is formed on the rear surface of the laminate, whereby it is possible to product an oxide superconducting wire in which a stabilization layer is brought into close contact with the outer circumference of the cross section of the laminate to increase airtightness. As a result, it is possible to prevent moisture from entering the oxide superconducting layer and to suppress deterioration of superconducting characteristics.

Effects of Invention

In the oxide superconducting wire according to the above-described aspect, the second protective layer is formed between the first protective layer formed of Ag or the Ag alloy and the solder layer. Accordingly, Ag or the Ag alloy does not come into contact with the solder, and it is possible to prevent the solder from being alloyed with Ag and embrittled. Therefore, it is possible to prevent the stabilization layer from being separated from the oxide superconducting wire.

The second protective layer formed of Cu or the Cu alloy has a thickness of 0.3 µm to 2.1 µm, whereby it is possible to suppress costs by reducing the thickness of the second protective layer in the cross section of the oxide superconducting wire, and to prevent separation of the stabilization layer due to embrittlement of Cu.

EMBODIMENTS FOR CARRYING OUT THE INVENTION

Figure 1:
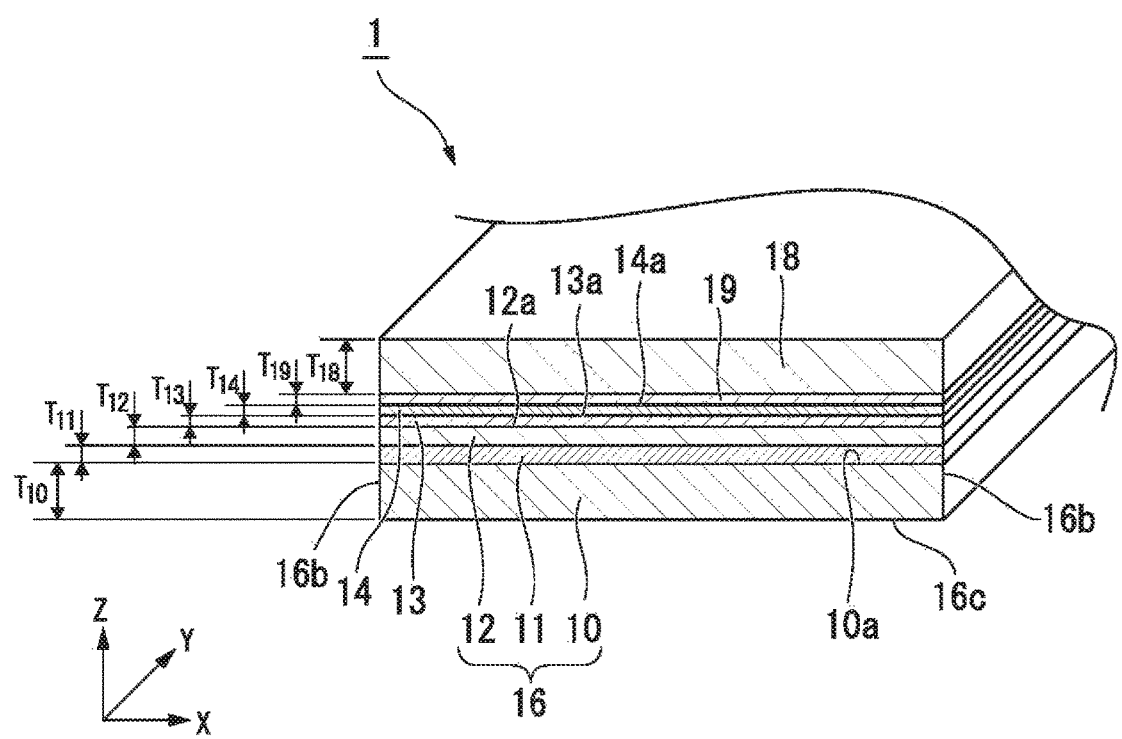
FIG. 1 is a sectional perspective view schematically showing an oxide superconducting wire according to a first embodiment of the invention.

Hereinafter, an oxide superconducting wire according to an embodiment of the invention will be described referring to the drawings. In the drawings used in the following description, in order to help understand features, for convenience, there are cases where portions having features are enlarged and shown, and the dimension ratios of respective components or the like are not limited to be the same as the actual ones. Furthermore, the invention is not limited to the following embodiments.

<First Embodiment>

FIG. 1 is a schematic view of a cross section of an oxide superconducting wire 1 of a first embodiment. The oxide superconducting wire 1 according to the embodiment includes a laminate 16, a first protective layer 13, a second protective layer 14, and a stabilization layer 18. The laminate 16 is formed by laminating an intermediate layer 11 and an oxide superconducting layer 12 on a tape-shaped base 10. The first protective layer 13 is laminated on a main surface 12a of the oxide superconducting layer 12 of the laminate 16. The second protective layer 14 is laminated on a main surface 13a of the first protective layer 13. The stabilization layer 18 is bonded to a main surface 14a of the second protective layer 14 with a solder layer 19 interposed therebetween.

In FIG. 1, a width direction of the wire is referred to as an X direction, a longitudinal direction is referred to as a Y direction, and a thickness direction is referred to as a Z direction.

For the base 10, a nickel alloy represented by Hastelloy (product name, manufactured by Haynes International Inc. in the United States of America), stainless steel, or a textured Ni—W alloy obtained by introducing a texture into a nickel alloy is applied.

A thickness $T_{10}$ of the base 10 may be adjusted as appropriate according to purposes, and may be a range of 10 to 500 µm.

The intermediate layer 11 is formed on the base 10. As an example, while the intermediate layer 11 has a laminate structure of a diffusion barrier layer, a bed layer, a textured layer, and a cap layer from the base side, one or both of the diffusion barrier layer and the bed layer may be omitted.

A thickness $T_{10}$ of the intermediate layer 11 may be approximately 0.01 µm to 5 µm.

The diffusion barrier layer is formed of $Si_3N_4$, $Al_2O_3$, GZO ($Gd_2Zr_2O_7$), or the like, and has, for example, a thickness of 10 to 400 nm.

The bed layer is a layer for reducing interface reaction and obtaining the orientation of the film formed thereon. As the material for forming the bed layer, $Y_2O_3$, $Er_2O_3$, $CeO_2$, $Dy_2O_3$, $Er_2O_3$, $Eu_2O_3$, $Ho_2O_3$, $La_2O_3$, and the like are used, and the thickness of the bed layer is, for example, 10 to 100 nm.

The textured layer is formed of a biaxially textured material in order to control the crystal orientation of the cap layer thereon. As the material for forming the textured layer, metal oxides, such as $Gd_2Zr_2O_7$, MgO, $ZrO_2$–$Y_2O_3$ (YSZ), $SrTiO_3$, $CeO_2$, $Y_2O_3$, $Al_2O_3$, $Gd_2O_3$, $Zr_2O_3$, $Ho_2O_3$, and $Nd_2O_3$, can be used. It is preferable that the textured layer be formed using an ion-beam-assisted deposition (IBAD) method.

The cap layer is film-formed on the surface of the textured layer and formed of a material such that crystal grains can be self-oriented in an in-plane direction, and specifically, is formed of $CeO_2$, $Y_2O_3$, $Al_2O_3$, $Gd_2O_3$, $ZrO_2$, YSZ, $Ho_2O_3$, $Nd_2O_3$, $LaMnO_3$, or the like. The cap layer can be formed to have a thickness in a range of 50 to 5000 nm.

The material of forming the oxide superconducting layer 12 may be a known material as an oxide superconductor, and specifically, $REBa_2Cu_3O_{7-X}$ (RE represents one or two or more of rare earth elements, such as Sc, Y, La, Ce, Pr, Nd, Pm, Sm, Eu, Gd, Tb, Dy, Ho, Er, Tm, Yb, and Lu), called an RE-123-based oxide superconductor, can be used. As the oxide superconducting layer 12, Y123 ($YBa_2Cu_3O_{7-X}$), Gd123 ($GdBa_2Cu_3O_{7-X}$), or the like can be used.

A thickness $T_{12}$ of the oxide superconducting layer 12 is approximately 0.5 to 5 µm, and preferably, is a uniform thickness.

The laminate 16 is constituted of the base 10, the intermediate layer 11, and the oxide superconducting layer 12 described above.

The first protective layer 13 is a layer which is formed of Ag or an Ag alloy on the main surface 12a of the oxide superconducting layer 12. The first protective layer 13 may be formed on a side surface 16b and a rear surface 16c of the laminate 16 as well as the main surface 12a.

The first protective layer 13 protects the oxide superconducting layer 12. Furthermore, the first protective layer 13 bypasses an overcurrent generated in accident. In addition, it is possible to suppress a chemical reaction occurring between the oxide superconducting layer 12 and the layer provided on the oxide superconducting layer 12, and to prevent degradation of superconducting characteristics due to collapse of a composition caused by a part of elements of one layer entering another layer side. The first protective layer 13 can be formed using a film formation method, such as a sputtering method, at normal temperature.

It is preferable that a thickness $T_{13}$ of the first protective layer 13 on the oxide superconducting layer 12 be 1 µm to 2 µm. The thickness $T_{13}$ is equal to or less than 2 µm, whereby it is possible to achieve reduction in costs by suppressing the amount of Ag used in the first protective layer 13. The thickness $T_{13}$ is equal to or greater than 1 µm, whereby it is possible to suppress the occurrence of a pinhole in the first protective layer 13 even if Ag is aggregated by thermal treatment during oxygen annealing. If a pinhole occurs in the first protective layer 13, there is a concern that the oxide superconducting layer 12 is exposed, the exposed portion is not protected by the first protective layer 13, and superconducting characteristics are deteriorated. $T_{13}$ is equal to or larger than 1 µm, whereby it is possible to reliably protect the oxide superconducting layer 12.

The second protective layer 14 is a layer which is formed of Cu or a Cu alloy on the main surface 13a of the first protective layer 13. The second protective layer 14 may be formed on the side surface 16b and the rear surface 16c of the laminate 16 as well as the main surface 13a.

The second protective layer 14 protects the oxide superconducting layer 12 along with the first protective layer 13, and bypasses an overcurrent occurring in accident. In addition, the second protective layer 14 suppresses diffusion of a metal (for example, Sn) constituting the solder layer 19 into the first protective layer 13. With this, alloying of Ag as the constituent element of the first protective layer 13 and the metal (for example, Sn) constituting the solder layer is suppressed.

Even in a case where a pinhole is formed in the first protective layer 13, the second protective layer 14 is formed, whereby the pinhole is covered with the second protective layer 14 to make it possible to reliably protect the oxide superconducting layer 12.

It is preferable that a thickness $T_{14}$ of a portion formed on the main surface 13a of the first protective layer 13 in the second protective layer 14 be 0.3 µm to 10 µm. It is more preferable that the thickness $T_{14}$ be 0.3 µm to 2.1 µm.

The thickness $T_{14}$ is equal to or less than 10 µm, whereby the oxide superconducting wire 1 can suppress the use amount of a material (Cu or Cu alloy) constituting the second protective layer 14 in the cross section thereof, and can achieve a reduction in costs.

The second protective layer 14 is obtained by forming a film of Cu or a Cu alloy using a sputtering method described below. If the second protective layer 14 is film-formed to have a thickness of greater than 2.1 μm by a single film formation process using a sputtering method, there is a concern that deterioration of the oxide superconducting layer 12 occurs. Accordingly, it is preferable that the thickness of the second protective layer 14 film-formed by single film formation be equal to or less than 2.1 μm. That is, even in a case where film formation is performed multiple times, it is preferable that the second protective layer 14 be formed to have a thickness of equal to or less than 2.1 μm per film formation. In order to suppress the number of times of film formation and to suppress film formation costs, it is preferable that the final thickness $T_{14}$ of the second protective layer 14 be equal to or less than 2.1 μm.

In a case where film formation is performed multiple times, and the thickness $T_{14}$ of the second protective layer 14 is greater than 2.1 μm, it is possible to more reliably prevent separation of the stabilization layer 18 due to alloying of solder and Cu of the second protective layer 14.

The second protective layer 14 is equal to or greater than 0.3 μm, whereby it is possible to prevent separation of the stabilization layer 18 due to alloying with Cu. If the solder layer 19 is formed on the second protective layer 14 formed of Cu or a Cu alloy, the metal (for example, Sn) constituting the solder layer 19 diffuses into the second protective layer 14. With this, Cu as the constituent element of the second protective layer 14 is alloyed with the metal (for example, Sn) constituting the solder layer and embrittlement of the second protective layer 14 occurs. If this embrittlement reaches the entire thickness of the second protective layer 14, the stabilization layer 18 is likely to be separated with the boundary between the first protective layer 13 and the second protective layer 14 as a starting point. Since the diffusion of the metal constituting the solder into Cu or the Cu alloy is less than 0.3 μm, the second protective layer 14 is equal to or greater than 0.3 μm, whereby it is possible to prevent separation of the stabilization layer 18 due to alloying of Cu.

The second protective layer 14 can be formed using a film formation method, such as a sputtering method, at normal temperature. An example of film formation of the second protective layer 14 using the sputtering method will be described below.

First, a target formed of Cu or a Cu alloy and the laminate 16 in which the first protective layer 13 is formed are arranged in a processing vessel which is decompressed to a vacuum state and into which Ar gas is introduced. At this time, the first protective layer 13 is arranged toward a target. Next, a voltage is applied to the target and discharged, whereby Ar gas is ionized to generate plasma. The target is sputtered with ions of Ar generated in plasma, sputter particles of Cu (or Cu alloy) are ejected from the target, and the sputter particles are deposited on the first protective layer 13, whereby the second protective layer 14 is film-formed.

In the film formation using the sputtering method, if the sputter particles (Cu particles) collide against an object to be film-formed (first protective layer 13), kinetic energy at the time of collision is converted to thermal energy, and temperature of the object to be film-formed increases. If heat is transmitted to the oxide superconducting layer 12 and temperature of the oxide superconducting layer 12 increases, there is a concern that oxygen in the oxide superconducting layer 12 slips out, the crystal structure collapses, and deterioration of superconducting characteristics occurs.

An increase in temperature of the object to be film-formed has a correlation relationship with the thickness (film formation rate) of the second protective layer 14 film-formed by single film formation. In order to suppress deterioration of superconducting characteristics of the oxide superconducting layer 12, it is preferable that the thickness of the second protective layer 14 film-formed per film formation be equal to or less than 2.1 μm.

An increase in temperature of the object to be film-formed in the film formation of the second protective layer 14 using the sputtering method may cause recrystallization of Ag of the first protective layer 13. Ag is aggregated by recrystallization to form a pinhole. In a case where the second protective layer 14 is film-formed to have a thickness of equal to or less than 2.1 μm by single film formation, it is possible to suppress an increase in temperature and to prevent recrystallization of Ag.

The solder layer 19 is arranged between the second protective layer 14 and the stabilization layer 18 formed of a metal tape to bond these layers.

The solder layer 19 can be formed as Sn plating formed on one surface of the metal tape. The metal tape subjected to Sn plating is arranged on the second protective layer 14 and heated, and Sn plating is molten and solidified, thereby bonding the metal tape and the second protective layer 14.

A thickness $T_{19}$ of the solder layer 19 is approximately 2 μm.

Solder used in the solder layer 19 is not particularly limited, and conventionally known solder is available. For example, lead-free solder formed of Sn or a Sn-based alloy, such as a Sn—Ag-based alloy, a Sn—Bi-based alloy, a Sn—Cu-based alloy, or a Sn—Zn-based alloy, Pb—Sn-based alloy solder, eutectic solder, low-temperature solder, and the like are exemplary examples, and these types of solder may be used alone or two or more in combination. Among these, solder having a melting point equal to or lower than 300° C. is preferably used. With this, the metal tape and the second protective layer 14 can be soldered at a temperature equal to or lower than 300° C. Accordingly, it is possible to suppress deterioration of characteristics of the oxide superconducting layer 12 due to heat of soldering.

The stabilization layer 18 is formed of the metal tape bonded onto the second protective layer 14 with the solder layer 19 interposed therebetween.

The material of the metal tape constituting the stabilization layer 18 may have satisfactory conductivity, and is not particularly limited. As the material of the metal tape, for example, comparatively inexpensive materials, such as copper, a copper alloy, such as brass (Cu—Zn alloy) or a Cu—Ni alloy, Ni alloy, and stainless steel, are preferably used. As the material of the metal tape, copper is particularly preferably used in view of high conductivity and comparatively inexpensiveness.

In the oxide superconducting wire 1, the stabilization layer 18 becomes a bypass which commutates an overcurrent generated in accident.

In a case where the oxide superconducting wire 1 is used in a superconducting fault current limiter, the stabilization layer 18 is used to instantly suppress an overcurrent generated when quenching occurs and transition is made to a normal conduction state. In this case, for the stabilization layer 18, a high-resistance metal made of one selected from a group consisting of a Ni—Cr alloy, a Ni alloy, stainless steel, and brass is preferably used. In particular, as a Ni alloy, Inconel (Registered Trademark) or Hastelloy (Registered Trademark) may be used.

A thickness $T_{18}$ of the stabilization layer 18 can be adjusted as appropriate, and preferably, for example, is 10 µm to 150 µm. If the thickness of the metal tape is too small, there is a concern that break occurs in a working process. If the thickness $T_{18}$ of the stabilization layer 18 is too large, bendability of the wire is damaged, and in the oxide superconducting wire 1, the occupancy of the stabilization layer 18 increases in the cross section thereof, and critical current density Jc (overall Jc) of the entire wire decreases.

In this embodiment, although an example where the metal tape is bonded only onto the second protective layer 14 with the solder layer 19 interposed therebetween to form the stabilization layer 18 has been described, the configuration of the stabilization layer 18 is not limited thereto.

For example, the metal tape may be molded to have a substantially C-shaped cross section and bonded with solder interposed therebetween to cover the rear surface 16c side of the laminate 16. The metal tape may be spirally wound around the outer circumference of the wire with solder interposed therebetween, or the like. As described above, the stabilization layer is formed to cover the circumferential surface of the wire, whereby it is possible to realize an airtight structure in which moisture does not enter the oxide superconducting layer and to suppress deterioration of superconducting characteristics.

In the oxide superconducting wire 1 according to this embodiment configured as above, it is preferable that the oxide superconducting layer 12 be formed to include a neutral surface in a thickness direction of the entire wire.

In a case where it is assumed that the rigidity of each layer is substantially identical, it is preferable that the oxide superconducting layer 12 be formed to include a position corresponding to half the thickness of the wire. Specifically, it is preferable that the thickness of each layer be constituted to satisfy the following relationship.

It is preferable that the difference between the sum of the thickness $T_{13}$ of the first protective layer 13, the thickness $T_{14}$ of the second protective layer 14, the thickness $T_{19}$ of the solder layer 19, and the thickness $T_{18}$ of the stabilization layer 18 and the sum of the thickness $T_{10}$ of the base 10 and the thickness $T_{11}$ of the intermediate layer 11 be smaller than the thickness $T_{12}$ of the oxide superconducting layer 12.

That is, it is preferable that the following expression be satisfied.

$$|(T_{13}+T_{14}+T_{18}+T_{19})-(T_{10}+T_{11})|<T_{12} \quad \text{[Equation 1]}$$

In a case where this relationship is satisfied, the oxide superconducting layer 12 is arranged at the center of the thickness of the oxide superconducting wire 1, and the neutral surface when the oxide superconducting wire 1 is bent in a plate thickness direction is constituted inside the oxide superconducting layer. Accordingly, in a case where the oxide superconducting wire 1 is curved, among bending stress applied to the respective layers, bending stress applied to the oxide superconducting layer becomes a minimum. Therefore, it is possible to reduce a load applied to the oxide superconducting layer 12 and to suppress deterioration of superconducting characteristics.

It is more preferable that the difference between the sum of the thickness $T_{13}$ of the first protective layer 13, the thickness $T_{14}$ of the second protective layer 14, the thickness $T_{19}$ of the solder layer 19, and the thickness $T_{18}$ of the stabilization layer 18 and the sum of the thickness $T_{10}$ of the base 10 and the thickness $T_{11}$ of the intermediate layer 11 be less than half the thickness $T_{12}$ of the oxide superconducting layer 12, that is, the right side of Equation 1 be $T_{12}/2$.

<Second Embodiment>

Figure 2:
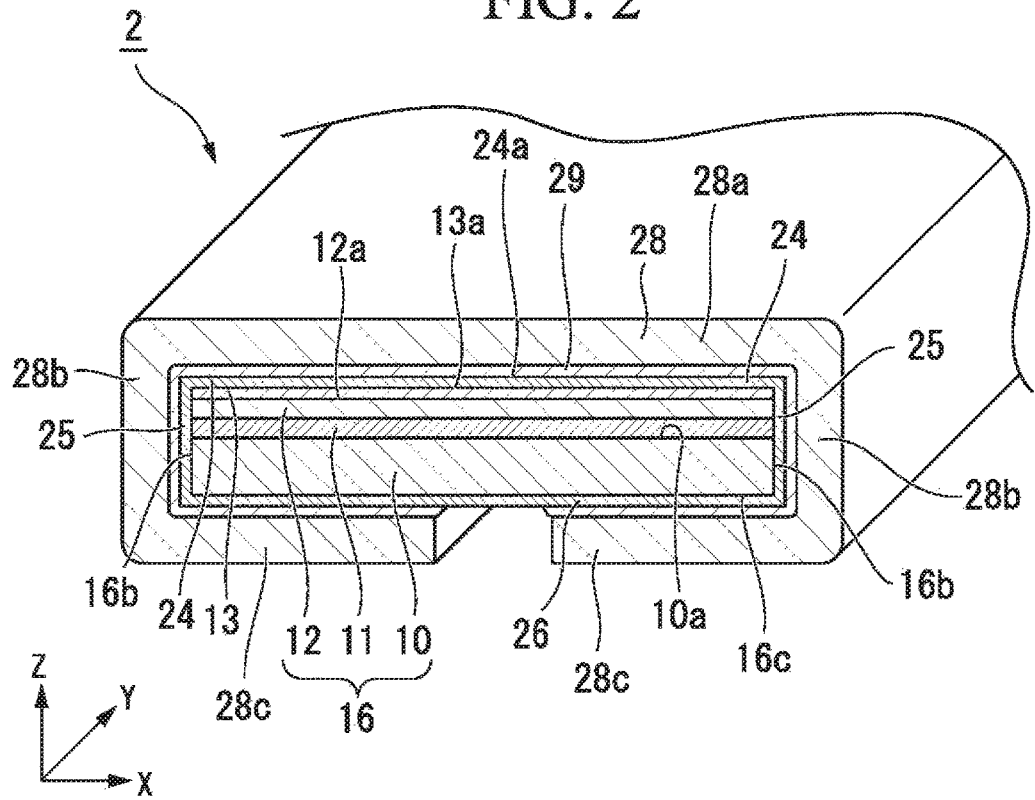
FIG. 2 is a sectional perspective view schematically showing an oxide superconducting wire according to a second embodiment of the invention.

FIG. 2 is a schematic view of a cross section of an oxide superconducting wire 2 of a second embodiment. The oxide superconducting wire 2 of the second embodiment is different from the oxide superconducting wire 1 of the first embodiment in that an outer circumference of a cross section of a laminate 16 is covered with a stabilization layer 28.

The same constituent elements as those in the first embodiment are represented by the same reference numerals, and description thereof will not be repeated. In FIG. 2, as in FIG. 1, the width direction of the wire is referred to as the X direction, the longitudinal direction is referred to as the Y direction, and the thickness direction is referred to as the Z direction.

The oxide superconducting wire 2 has a laminate 16 in which an intermediate layer 11 and an oxide superconducting layer 12 are laminated on a tape-shaped base 10. A first protective layer 13 is laminated on a main surface 12a of the oxide superconducting layer 12 of the laminate 16. A second protective layer 24 is formed on a main surface 13a of the first protective layer 13. A rear surface layer 26 is laminated on a rear surface 16c of the laminate 16 on the base 10 side, and a side surface layer 25 is laminated on a side surface 16b of the laminate 16. Accordingly, the laminate 16 is constituted such that the outer circumference (the outer circumference of the cross section) is covered with the second protective layer 24, the side surface layer 25, and the rear surface layer 26. A stabilization layer 28 is bonded to the second protective layer 24, the side surface layer 25, and the rear surface layer 26 with a solder layer 29 interposed therebetween.

The second protective layer 24 is a layer which is formed of Cu or a Cu alloy on the main surface 13a of the first protective layer 13. The second protective layer 24 is formed integrally with the side surface layer 25 and the rear surface layer 26. That is, the materials of the side surface layer 25 and the rear surface layer 26 are the same as the material of the second protective layer 24.

The second protective layer 24 protects the oxide superconducting layer 12 along with the first protective layer 13, and bypasses an overcurrent generated in accident. In addition, the second protective layer 24 suppresses diffusion of the metal (for example, Sn) constituting the solder layer 29 into the first protective layer 13 and alloying.

Even in a case where a pinhole is formed in the first protective layer 13, the second protective layer 24 is formed, whereby the pinhole is covered with the second protective layer 24 and it is possible to prevent solder from coming into contact with the oxide superconducting layer 12.

The thickness of the second protective layer 24 is preferably e 0.3 µm to 10 µm, and more preferably 0.3 µm to 2.1 µm.

The thickness of the second protective layer 24 is equal to or less than 10 µm, whereby it is possible to suppress the use amount of the material (Cu or Cu alloy) constituting the second protective layer 24 and to achieve reduction in costs.

The second protective layer 24 can be formed using a film formation method, such as a sputtering method, at normal temperature. The thickness of the second protective layer 24 film-formed by single film formation is equal to or less than 2.1 µm, whereby it is possible to reduce heat generated at the time of film formation and to suppress desorption of oxygen in the oxide superconducting layer 12. It is also possible to prevent recrystallization of Ag of the first protective layer 13 at the time of film formation of the second protective layer 24.

The thickness of the second protective layer 24 is equal to or greater than 0.3 μm, whereby it is possible to prevent separation of the stabilization layer 28 due to alloying of Cu.

The rear surface layer 26 is a layer which is formed of Cu or a Cu alloy on the rear surface 16c of the laminate 16 on the base 10 side.

The rear surface layer 26 is electrically connected to the second protective layer 24 through the side surface layer 25 and the stabilization layer 28.

The rear surface layer 26 is bonded to a rear surface portion 28c of the stabilization layer 28 arranged on the rear surface 16c of the laminate 16 with the solder layer 29 interposed therebetween. Since the rear surface layer 26 is formed of Cu or a Cu alloy, adhesion to solder is high. Accordingly, the rear surface layer 26 is easily bonded to the rear surface portion 28c of the stabilization layer 28.

As an example, a method of forming the rear surface layer 26 formed of Cu will be described. The rear surface layer 26 formed of Cu can be formed using a sputtering method similarly to the second protective layer 24. The film formation of the rear surface layer 26 can be performed by arranging a Cu target on the base 10 side (the rear surface 16c side) of the laminate 16 and applying and discharging a voltage to the Cu target such that sputter particles of Cu are deposited on the rear surface 16c of the laminate 16.

It is preferable that the thickness of the rear surface layer 26 be 0.3 μm to 2.1 μm.

If the rear surface layer 26 having a thickness of greater than 2.1 μm is about to be formed by a single film formation process using the sputtering method, there is a concern that heat at the time of film formation is transmitted to the oxide superconducting layer 12 and oxygen in the oxide superconducting layer 12 is desorbed. The thickness of the rear surface layer 26 is equal to or greater than 0.3 μm, whereby it is possible to prevent separation of the stabilization layer 28 due to alloying of Cu.

In a case where the film formation process of the rear surface layer 26 is divided and performed into multiple times, the rear surface layer 26 may be formed to have a thickness of greater than 2.1 μm such that the thickness is set to be equal to or less than 2.1 μm by the single film formation process. In this case, it is preferable that the thickness of the rear surface layer 26 be in a range of equal to or less than 10 μm in consideration of costs of the film formation process. The rear surface layer 26 is bonded to the end portion of the cross section of the stabilization layer 28 covering the laminate 16 in a C shape with the solder layer 29 interposed therebetween. For this reason, solder bonding of the rear surface layer 26 and the stabilization layer 28 is likely to become a starting point of separation of the stabilization layer 28. The thickness of the rear surface layer 26 is greater than 2.1 μm, whereby it is possible to more reliably prevent separation due to embrittlement caused by alloying of solder and Cu.

The side surface layer 25 is a layer which is formed of Cu or a Cu alloy on the side surface 16b of the laminate 16 on the base 10 side. The side surface layer 25 is formed integrally with the second protective layer 24 and the rear surface layer 26.

The side surface layer 25 is film-formed at the same time with film-forming the second protective layer 24 and the rear surface layer 26 using the sputtering method. In the film-formation of the second protective layer 24 using the sputtering method, sputter particles (Cu particles) wraps around the side surface 16b of the laminate 16 and the Cu particles are deposited thereon. Similarly, in the film formation of the rear surface layer 26 using the sputtering method, the Cu particles are deposited on the rear surface 16c of the laminate 16. This is because the sputter particles collide against inert gas (for example, Ar) in the processing vessel and the direction of motion thereof changes.

In this way, the side surface layer 25, the second protective layer 24, and the rear surface layer 26 are integrated and surround the cross section of the laminate 16.

The stabilization layer 28 is formed of a metal tape arranged to have a substantially C-shaped cross section along the second protective layer 24, the side surface layer 25, and the rear surface layer 26. The stabilization layer 28 is arranged to wrap around both side surfaces 16b and 16b from the main surface of the laminate 16 and to reach the rear surface 16c. The stabilization layer 28 is bonded to the second protective layer 24, the side surface layer 25, and the rear surface layer 26 with the solder layer 29 interposed therebetween.

The stabilization layer 28 is formed of copper, a copper alloy, such as brass (Cu—Zn alloy) or Cu—Ni alloy, a Ni alloy, stainless steel, or the like, and becomes a bypass which commutates an overcurrent generated in accident. The stabilization layer 28 is used to instantly suppress an overcurrent generated when quenching occurs and transition is made to a normal conduction state in a case where the oxide superconducting wire 2 is used in a superconducting fault current limiter.

The stabilization layer 28 can be formed by arranging the laminate 16 on the surface of the metal tape provided with the solder layer 29 using platting or the like, wrapping and bending the circumferential surface to have a substantially C-shaped cross section, heating and melting the solder layer 29, and pressing the solder layer 29 with a roller. The laminate 16 is formed by laminating the first protective layer 13, the second protective layer 24, and the rear surface layer 26.

The stabilization layer 28 has a main surface portion 28a arranged on the oxide superconducting layer 12 side of the laminate 16, a side surface portion 28b arranged on the side surface 16b side of the laminate 16, and a rear surface portion 28c arranged on the rear surface 16c side of the laminate 16. The main surface portion 28a of the stabilization layer 28 is bonded to the second protective layer 24 with the solder layer 29 interposed therebetween. Similarly, the side surface portion 28b of the stabilization layer 28 is bonded to the side surface layer 25 with the solder layer 29 interposed therebetween, and the rear surface portion 28c of the stabilization layer 28 is bonded to the rear surface layer 26 with the solder layer 29 interposed therebetween.

The oxide superconducting wire 2 according to the second embodiment is constituted such that the stabilization layer 28 is bonded to solder with the second protective layer 24 formed of Cu or a Cu alloy interposed therebetween. With this, the first protective layer 13 formed of Ag or an Ag alloy does not come into contact with solder, and it is possible to suppress solder from being alloyed with Ag and embrittled, and to prevent separation of the stabilization layer 28.

In general, a Ni-based alloy (for example, Hastelloy) which is suitably used as the material of the base 10 is known as a material having low adhesion to solder, and it is difficult to bond the stabilization layer 28 to the base 10 with the solder layer 29 interposed therebetween.

The oxide superconducting wire 2 according to this embodiment is constituted such that the outer circumference (in particular, the rear surface 16c) of the cross section of the laminate 16 is covered with the layers (the second protective layer 24, the side surface layer 25, and the rear surface layer 26) formed of Cu or a Cu alloy having satisfactory adhesion to solder. Accordingly, the stabilization layer 28 comes into close contact with the outer circumference of the cross section of the laminate 16 with the solder layer 29 interposed therebetween, thereby increasing airtightness of the oxide superconducting wire 2. With this, it is possible to prevent moisture from entering the oxide superconducting layer 12, and to suppress deterioration of superconducting characteristics.

In a case where a material, such as a Ni-based alloy (for example, Hastelloy), having low adhesion to solder is used as a metal material constituting the stabilization layer 28, it is preferable that surface treatment or the like for increasing adhesion to solder be performed on the surface of the stabilization layer 28 in advance.

The oxide superconducting wire 2 according to the second embodiment is constituted such that the side surface layer 25 is formed on the two side surfaces 16b of the laminate 16 and the side surface portion 28b of the stabilization layer 28 is bonded to the side surfaces with the solder layer 29 interposed therebetween. However, even in a case where the side surface layer 25 is not provided and the stabilization layer 28 is not bonded to the side surface 16b of the laminate 16, the rear surface 16c of the laminate 16 may be bonded to the rear surface portion 28c of the stabilization layer 28. In this case, since the rear surface portion 28c of the stabilization layer 28 is bonded airtight to the rear surface layer 26 film-formed on the rear surface 16c of the laminate 16 with the solder layer 29 interposed therebetween, it is possible to suppress moisture from reaching the oxide superconducting layer 12.

The oxide superconducting wire 1 (or the oxide superconducting wire 2) described above is available in various superconducting devices. As an example of a superconducting device including the oxide superconducting wire 1, a superconducting coil laminate 100 and a superconducting coil 101 will be described referring to FIGS. 3A and 3B.

Figure 3A:
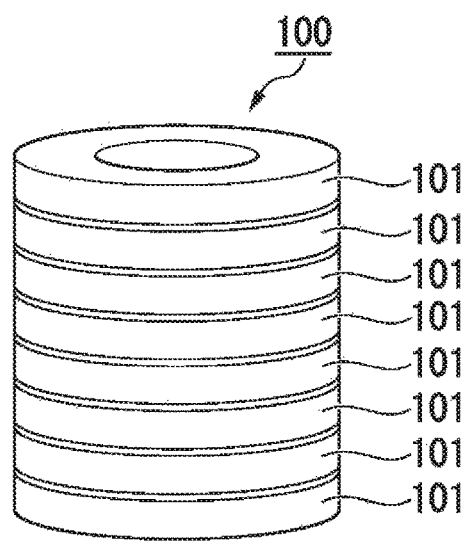
FIG. 3A is a perspective view showing an example of a superconducting coil and showing a laminate of the superconducting coil.
Figure 3B:
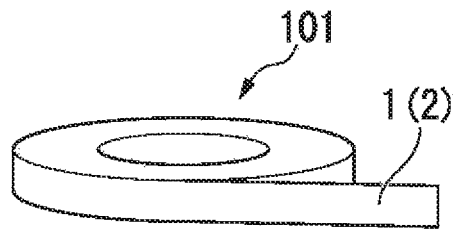
FIG. 3B is a perspective view showing an example of a superconducting coil and showing a single superconducting coil.

The superconducting coil 101 shown in FIG. 3B can be formed by winding the oxide superconducting wire 1 (or the oxide superconducting wire 2). The superconducting coil laminate 100 shown in FIG. 3A can be formed by laminating a plurality of superconducting coils 101 and connecting the superconducting coils 101 to each other.

The superconducting coil 101 and the superconducting coil laminate 100 can generate powerful magnetic force when a current flows in the oxide superconducting wire 1 (or the oxide superconducting wire 2).

(Superconducting Fault Current Limiter)

Figure 4:
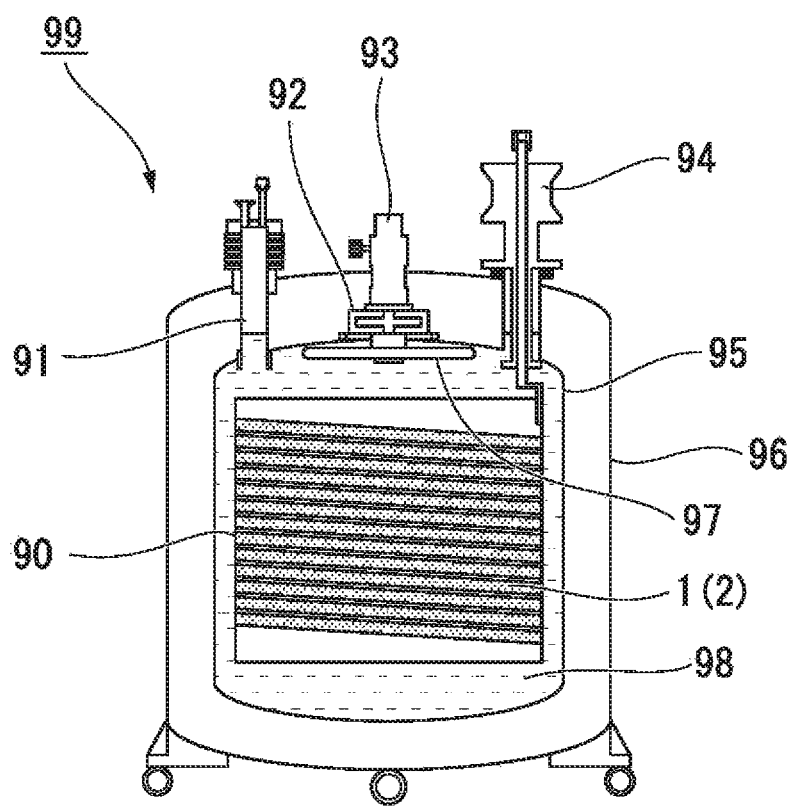
FIG. 4 is a sectional view showing an example of a superconducting fault current limiter.

FIG. 4 shows a superconducting fault current limiter 99 according to an embodiment of the invention.

In the superconducting fault current limiter 99, a superconducting fault current limiter module 90 is constituted by winding the oxide superconducting wire 1 (or the oxide superconducting wire 2) around a winding drum in a plurality of layers. The superconducting fault current limiter module 90 is stored in a liquid nitrogen vessel 95 which is filled with liquid nitrogen 98. The liquid nitrogen vessel 95 is stored in a vacuum vessel 96 which blocks heat from the outside.

The liquid nitrogen vessel 95 has, in an upper portion, a liquid nitrogen filling section 91 and a refrigerator 93. Below the refrigerator 93, a heat anchor 92 and a hot plate 97 are provided.

The superconducting fault current limiter 99 has a current lead section 94 for connecting an external power supply (not shown) to the superconducting fault current limiter module 90.

In a case where the oxide superconducting wire 1 (or the oxide superconducting wire 2) is used in the superconducting fault current limiter module 90 of the superconducting fault current limiter 99, it is preferable that the stabilization layer 18 (or the stabilization layer 28) of the oxide superconducting wire 1 (or the oxide superconducting wire 2) be formed of one selected from a group consisting of a Ni—Cr alloy, a Ni alloy, stainless steel, and brass. With this, it is possible to instantly suppress an overcurrent generated when quenching occurs and transition is made to a normal conduction state.

The oxide superconducting wire 1 (or the oxide superconducting wire 2) is used in a superconducting device, whereby it is possible to realize a superconducting device having high reliability.

A superconducting device is not particularly limited as long as the oxide superconducting wire 1 (or the oxide superconducting wire 2) is provided, in addition to the superconducting coil 101 and the superconducting coil laminate 100 described referring to FIGS. 3A and 3B and the superconducting fault current limiter 99 described referring to FIG. 4. As a superconducting device, for example, a superconducting cable, a superconducting motor, a superconducting transformer, a superconducting power storage device, or the like can be shown.

EXAMPLES

Hereinafter, the invention will be described in more detail in connection with examples, but the invention is not limited to these examples.

<Test 1>

As Test 1, an oxide superconducting wire having the structure shown in FIG. 1 was evaluated.

<Production of Sample>

First, the surface of a tape-shaped based formed of Hastelloy C-276 (product name, manufactured by Haynes International Inc. in the United States of America) having a width of 10 mm, a thickness of 0.075 mm, and a length of 1000 mm was polished using alumina having an average particle size of 3 μm. Next, the surface of the base was degreased and cleaned by acetone.

A film of $Al_2O_3$ (diffusion barrier layer: thickness of 100 nm) was formed on a main surface of the base using a sputtering method, and a film of $Y_2O_3$ (bed layer; thickness of 30 nm) was formed on the film of $Al_2O_3$ using an ion beam sputtering method.

Next, MgO (metal oxide layer; thickness of 5 to 10 nm) was formed on the bed layer using an ion-beam-assisted vapor deposition method (IBAD method), and a film of $CeO_2$ (cap layer) having a thickness of 500 nm was formed on the MgO layer using a pulse laser vapor deposition method (PLD method). Next, $GdBa_2Cu_3O_{7-x}$ (oxide superconducting layer) having a thickness of 2.0 μm was formed on the $CeO_2$ layer using a PLD method.

A sample A produced in this way is used in common in sample production after Test 1.

(Samples No. 1 and No. 2)

For the sample A described above, a first protective layer formed of Ag was formed on the oxide superconducting layer using a sputtering method.

Next, oxygen annealing was performed on this sample.

Next, a metal tape formed of Cu subjected to Sn plating at a thickness of 2 μm on one surface to have a width of 10 mm, a thickness of 0.075 mm, and a length of 1000 mm was prepared. The metal tape and the sample were superimposed with Sn plating and the first protective layer facing each other and were passed through a furnace heated at 280° C. With this, Sn was molten to form a solder layer, and the metal tape and the first protective layer were bonded.

Through the above procedure, oxide superconducting wires of Samples No. 1 and No. 2 were obtained. The thickness of the first protective layer is described collectively in Table 1 described below.

(Samples No. 3 to No. 9)

For the sample A described above, a first protective layer formed of Ag was formed on the oxide superconducting layer using a sputtering method.

Next, oxygen annealing was performed on this sample.

Next, for this sample, a second protective layer formed of Cu was formed on the first protective layer using a sputtering method. In the film formation using the sputtering method, the first protective layer is formed by a single film formation process (the first protective layer is not formed by a plurality of film formation processes).

Next, a metal tape formed of Cu subjected to Sn plating at a thickness of 2 μm on one surface to have a width of 10 mm, a thickness of 0.075 mm, and a length of 1000 mm was prepared. The metal tape and the sample were superimposed with Sn plating and the second protective layer facing each other and were passed through a furnace heated at 280° C. With this, Sn was molten to form a solder layer, and the metal tape and the second protective layer were bonded.

Through the above procedure, oxide superconducting wires of Samples No. 3 to No. 9 shown in Table 1 described below were obtained. The thicknesses of the first protective layer and the second protective layer are described collectively in Table 1 described below.

In the oxide superconducting wires of Samples No. 1 to No. 9 described above, the temperature and time of oxygen annealing were changed according to the thickness of the protective layer.

In a case where the thickness of the protective layer was 2 μm, oxygen annealing was performed at 500° C. for 10 hours, and after the furnace was cooled for 26 hours, the sample was taken out. In a case where the thickness of the protective layer was 1 μm (Samples No. 2 and No. 5), oxygen annealing was performed at 300° C. for 15 hours, and after the furnace was cooled for 20 hours, the sample was taken out.

<Evaluation>

(Critical Current Characteristics)

For each of the oxide superconducting wires of Samples No. 1 to No. 9, three oxide superconducting wires were prepared, and critical current density values (Ic) of these oxide superconducting wires were measured using a four-terminal method. The average value of Ic of the three oxide superconducting wires is shown in Table 1.

(Separation Strength)

For the oxide superconducting wires of Samples No. 1 to No. 9, the separation strength of the metal tape was measured.

In the measurement, the separation strength of the metal tape was measured by a stud pull separation test. In the measurement of the separation strength, a tip portion of a stud pin having a diameter of 2.7 mm was adhered and fixed to the surface of the metal tape with epoxy resin (the adhesion area of the pin tip portion was 5.72 mm²). Then, the stud pin was pulled in a vertical direction with respect to the film-formed surface of the wire, and the measurement was performed with a maximum tensile load until stress decreases as separation stress (separation strength).

In the stud pull separation test, a measurement was performed at 10 places for each sample. An average value of the measured value is shown in Table 1.

The measurement of the separation strength was performed until stress became 30 MPa. In Table 1 described below, ">30" means that separation does not occur when stress of 30 MPa is applied, and indicates that the separation strength is equal to or greater than 30 MPa.

TABLE 1

| Sample No. | | Respective Layers | | Evaluation | |
|---|---|---|---|---|---|
| | | First Protective Layer Thickness [μm] | Second Protective Layer Thickness [μm] | Critical Current Value [A] | Separation Strength Average [MPa] |
| 1 | Comparative Example | 2.0 | No | 596 | 17.3 |
| 2 | Comparative Example | 1.0 | No | 599 | 4.6 |
| 3 | Comparative Example | 2.0 | 2.2 | 571 | >30 |
| 4 | Comparative Example | 2.0 | 0.2 | 598 | 25.1 |
| 5 | Example | 1.0 | 1.0 | 597 | >30 |
| 6 | Example | 2.0 | 0.5 | 599 | >30 |
| 7 | Example | 2.0 | 1.0 | 598 | >30 |
| 8 | Example | 2.0 | 2.1 | 596 | >30 |
| 9 | Example | 2.0 | 0.3 | 596 | >30 |

Out of the result shown in Table 1, referring to the critical current density value Ic, the critical current density value of the oxide superconducting wire of Sample No. 3 is comparatively low. In the oxide superconducting wire of Sample No. 3, the second protective layer is formed to have a thickness of 2.2 μm by a single film formation processing using a sputtering method. For this reason, it is considered that heat is applied to the oxide superconducting layer, and deterioration of superconducting characteristics occurs.

In contrast, in other samples, deterioration of superconducting characteristics is not found.

Out of the result shown in Table 1, referring to the separation strength, the oxide superconducting layers of Samples No. 1, No. 2, No. 4 have comparatively low separation strength.

Of these, the oxide superconducting wires of Samples No. 1 and No. 2 do not have the second protective layer. As a result of observing a separation surface after separation in these samples, the separation surface was present between the first protective layer and the stabilization layer. From this, it is considered that Ag of the first protective layer and Sn of the solder layer are alloyed to cause embrittlement, and the separation strength is degraded.

While the oxide superconducting wire of Sample No. 4 has the second protective layer, the thickness of the second protective layer is 0.2 μm. As a result of observing a separation surface after separation in this sample, the separation surface was present between the second protective layer and the stabilization layer. From this, it is considered that Cu of the second protective layer and Sn of the solder layer are alloyed to cause embrittlement, and separation strength is degraded. That is, it has been confirmed that, in a case where the second protective layer is less than 0.3 μm, the second protective layer is likely to be embrittled.

In Samples No. 3, and No. 5 to No. 9, the separation strength between the stabilization layer and the first and second protective layers is a value equal to or greater than 30 MPa, and separation strength is comparatively high. From this, it has been confirmed that embrittlement of the first and second protective layers does not occur, and it is possible to prevent separation of the stabilization layer. That is, it has been confirmed that the second protective layer having a thickness of 0.3 μm or more is further formed on the first protective layer formed of Ag, thereby improving the separation strength of the stabilization layer.

<Test 2>

As Test 2, an oxide superconducting wire showing the structure shown in FIG. 2 was evaluated.

<Production of Sample>

First, the sample A used in Test 1 is prepared. The sample A is used in common in sample production after Test 2.

(Sample No. 10)

For the sample A described above, Ag is formed on the oxide superconducting layer to have a thickness of 2 μm using a sputtering method.

Next, oxygen annealing processing was performed at 500° C. for 10 hours, and after the furnace was cooled for 26 hours, the sample was taken out.

Next, the sample was cut into two parts with a laser beam to obtain a wire having a width of 5 mm.

Next, a film of Ag was further formed on the Ag layer having a thickness of 2 μm of the wire to have a thickness of 6 μm using a sputtering method, and a first protective layer having a thickness of 8 μm in total was formed.

Next, a rear surface layer was film-formed of Ag on the rear surface of the wire on the base side to have a thickness of 1 μm using a sputtering method, oxygen annealing processing was performed at 500° C. for 10 hours again, and after the furnace was cooled for 26 hours, the sample was taken out.

Next, a metal tape subjected to Sn plating (melting point of 230° C., solder layer) at a thickness of 5 μm was prepared, was bent in a substantially C shape to wrap around the outer circumference of the wire, and was heated at 280° C. and passed, and a stabilization layer formed of the metal tape was formed on the outer circumference of the wire.

Through the above procedure, the oxide superconducting wire of Sample No. 10 was obtained. The materials, thicknesses, and the like of the respective layers are described collectively in Table 2.

(Samples No. 11 to No. 13)

For the sample A described above, a first protective layer formed of Ag is formed on the oxide superconducting layer to have a thickness of 2 μm using a sputtering method.

Next, oxygen annealing processing was performed at 300° C. for 15 hours, and after the furnace was cooled for 20 hours, the sample was taken out.

Next, the sample was cut into two parts with a laser beam to obtain a wire having a width of 5 mm.

Next, a second protective layer formed of Cu was film-formed on the main surface of the first protective layer of the wire to have a thickness of 1 μm using a sputtering method.

Next, a rear surface layer formed of Cu was film-formed on the rear surface of the wire on the base side to have a thickness of 1 μm using a sputtering method.

Next, a metal tape subjected to Sn plating (melting point of 230° C., solder layer) at a thickness of 5 μm was prepared, was bent in a substantially C shape to wrap around the outer circumference of the wire, and was heated at 280° C. and passed, and a stabilization layer formed of the metal tape was formed on the outer circumference of the wire.

Through the above procedure, the oxide superconducting wires of Samples No. 11 to No. 13 were obtained. The materials, thicknesses, and the like of the respective layers are described collectively in Table 2 described below.

<Evaluation>

(Room Temperature Resistance)

The electrical resistance (room temperature resistance) at room temperature (25° C.) of the oxide superconducting wires of Samples No. 10 to No. 13 was measured by a four-terminal method. Since the oxide superconducting layer does not show superconducting characteristics at room temperature, the room temperature resistance primarily becomes combined resistance of the first protective layer, the second protective layer, the rear surface layer, the stabilization layer, and the like.

The test result is described collectively in Table 3.

For the oxide superconducting wires of Samples No. 10 and No. 11, the separation strength of the metal tape (stabilization layer) was measured by the same stud pull separation test as in Test 1.

The measurement was performed on the front surface side (the side on which the oxide superconducting layer is arranged) of the oxide superconducting wire and the rear surface side (the side on which the base is arranged) of the oxide superconducting wire.

The test result is described collectively in Table 3.

TABLE 2

| Sample No. | | First Protective Layer | | Second Protective Layer | | Rear Surface Layer | | Stabilization Layer (Metal Tape) | | |
|---|---|---|---|---|---|---|---|---|---|---|
| | | Material | Thickness (μm) | Material | Thickness (μm) | Material | Thickness (μm) | Material | Thermal Conductivity (W/(m·K)) | Thickness (μm) |
| 10 | Comparative Example | Ag | 8 | | | Ag | 1 | Cu | 398 | 20 |
| 11 | Example | Ag | 2 | Cu | 1 | Cu | 1 | Cu | 398 | 20 |
| 12 | Example | Ag | 2 | Cu | 1 | Cu | 1 | Ni—Cr | 13.4 | 20 |
| 13 | Example | Ag | 2 | Cu | 1 | Cu | 1 | Brass | 121 | 20 |

TABLE 3

| | | Evaluation | | | |
|---|---|---|---|---|---|
| | | Room Temperature | Front Surface-Side Separation Strength | | Rear Surface-Side Separation Strength | |
| Sample No. | | Resistance (mΩ/m) | Average (MPa) | Standard Deviation (MPa) | Average (MPa) | Standard Deviation (MPa) |
| 10 | Comparative Example | 115.9 | 34.6 | 4.2 | 29.4 | 2.5 |
| 11 | Example | 116.9 | 57.9 | 4.4 | 58.7 | 1.9 |
| 12 | Example | 117.6 | | | | |
| 13 | Example | 117.2 | | | | |

The thicknesses and room temperature resistance of the oxide superconducting wires of Samples No. 10 and No. 11 are compared.

Sample No. 11 has higher separation strength on both of the front surface side and the rear surface side. From this, it has been confirmed that the second protective layer is provided, thereby increasing separation strength.

In the oxide superconducting wire of Sample No. 10, the first protective layer (Ag) having a thickness of 8 μm is formed on the front surface. On the other hand, in the oxide superconducting wire of Sample No. 11, the first protective layer (Ag) having a thickness of 2 μm and the second protective layer (Cu) having a thickness of 1 μm were formed on the front surface, and the total thickness of these layers was 3 μm. The second protective layer is provided, thereby forming an oxide superconducting wire having a small thickness. Since the first protective layer and the second protective layer become a current path at room temperature, the thicknesses of these layers are made small, whereby it is possible to increase room temperature resistance, and to suitably use the oxide superconducting wire in a superconducting fault current limiter.

Comparing Sample No. 11, Sample No. 12, and Sample No. 13, it has been confirmed that a Ni—Cr alloy or brass is used as the material constituting the stabilization layer, thereby further increasing the room temperature resistance.

As shown in Table 2, a Ni—Cr alloy and brass have low thermal conductivity compared to Cu.

In a case where an oxide superconducting wire is used in a superconducting fault current limiter, the thermal conductivity of the stabilization layer is lowered, whereby it is possible to suppress the spread of local heat generation to the entire superconducting fault current limiter. Therefore, it is possible to prevent the spread of a region where superconducting characteristics are damaged.

The periphery of the oxide superconducting wire is covered with the stabilization layer formed of a Ni—Cr alloy or brass, whereby it is possible to suitably use the oxide superconducting wire in a superconducting fault current limiter.

Although the embodiments of the invention have been described above, the respective configurations in the embodiments, combinations thereof, and the like are examples, and additions, omission, replacements, and other modifications of configurations may be made without departing from the invention. The invention is not limited to the embodiments.

DESCRIPTION OF REFERENCE NUMERAL 1, 2: oxide superconducting wire, 10: base, 11: intermediate layer, 12: oxide superconducting layer, 12a, 13a, 14a: main surface, 13: first protective layer, 14, 24: second protective layer, 16: laminate, 16b: side surface, 16c: rear surface, 18, 28: stabilization layer, 19, 29: solder layer, 25: side surface layer, 26: rear surface layer, 99: superconducting fault current limiter, 100: superconducting coil laminate, 101: superconducting coil

The invention claimed is:

1. An oxide superconducting wire comprising:
   a laminate which is formed by laminating a tape-shaped base, an intermediate layer, and an oxide superconducting layer;
   a first protective layer which is formed of Ag or an Ag alloy and is laminated on a main surface of the oxide superconducting layer of the laminate;
   a second protective layer which is formed of Cu or a Cu alloy, is laminated on a main surface of the first protective layer by performing film formation one or more times, and has a thickness of 0.3 μm to 10 μm, the second protective layer being formed of a plurality of laminated layers where each of the laminated layers has a thickness of equal to or less than 2.1 μm; and
   a stabilization layer which is bonded to a main surface of the second protective layer with a solder layer interposed therebetween,
   wherein the second protective layer is formed to have a thickness of equal to or less than 2.1 μm per film formation in each of the laminated layers.

2. The oxide superconducting wire according to claim 1, wherein the oxide superconducting layer is formed to include a neutral surface in a thickness direction of an entire of the oxide superconducting wire.

3. The oxide superconducting wire according to claim 1, further comprising:
   a rear surface layer which is laminated on a rear surface of the base of the laminate and is formed of Cu or a Cu alloy,
   wherein the stabilization layer is arranged to wrap around both side surfaces from a main surface of the laminate and to reach a rear surface, and is bonded to the rear surface layer with a solder layer interposed therebetween.

4. The oxide superconducting wire according to claim 1, wherein the stabilization layer is formed of one of a group consisting of a Ni—Cr alloy, a Ni alloy, stainless steel, and brass.

5. The oxide superconducting wire according to claim 1, wherein the second protective layer has a thickness of equal to or less than 2.1 μm.

6. A superconducting device comprising:
   the oxide superconducting wire according to claim 1.

7. A method of producing an oxide superconducting wire, the method comprising:
  preparing a laminate in which an intermediate layer and an oxide superconducting layer are formed on a tape-shaped base;
  forming a first protective layer formed of Ag or an Ag alloy on a main surface of the oxide superconducting layer of the laminate using a sputtering method;
  forming a second protective layer formed of Cu or a Cu alloy to have a thickness of 0.3 μm to 2.1 μm on a main surface of the first protective layer using a sputtering method; and
  forming a stabilization layer by bonding a metal tape to a main surface of the second protective layer with a solder layer interposed therebetween,
  wherein, when forming the second protective layer, film formation is performed one or more times, and the second protective layer is formed to have a thickness of equal to or less than 2.1 μm per film formation, such that the second protective layer is formed of a plurality of laminated layers where each of the laminated layers has a thickness of equal to or less than 2.1 μm.

8. The method of producing an oxide superconducting wire according to claim 7,
  wherein, before forming the stabilization layer, a rear surface layer formed of Cu or a Cu alloy is formed on a rear surface of the base of the laminate using a sputtering method, and
  when forming the stabilization layer, the metal tape is arranged to wrap around the rear surface by way of both side surfaces from a main surface of the laminate, and the metal tape is bonded to the rear surface layer with a solder layer interposed therebetween.

* * * * *